United States Patent
Kleinhans

(10) Patent No.: US 9,287,866 B2
(45) Date of Patent: Mar. 15, 2016

(54) SENSOR ELEMENT DEVICE AND METHOD FOR PRODUCING A MOLDED BODY OF A SENSOR ELEMENT DEVICE

(75) Inventor: Andreas Kleinhans, Eppingen (DE)

(73) Assignee: E.G.O. Elektro-Gerätebau GmbH, Oberderdingen (DE)

( * ) Notice: Subject to any disclaimer, the term of this patent is extended or adjusted under 35 U.S.C. 154(b) by 1047 days.

(21) Appl. No.: 13/344,149

(22) Filed: Jan. 5, 2012

(65) Prior Publication Data

US 2012/0126834 A1 May 24, 2012

Related U.S. Application Data

(63) Continuation of application No. PCT/EP2010/060488, filed on Jul. 20, 2010.

(30) Foreign Application Priority Data

Jul. 28, 2009 (DE) .......... 10 2009 036 161

(51) Int. Cl.
*G01R 27/26* (2006.01)
*H03K 17/96* (2006.01)

(52) U.S. Cl.
CPC ...... *H03K 17/962* (2013.01); *H03K 2017/9602* (2013.01); *H03K 2217/96076* (2013.01); *H03K 2217/96079* (2013.01); *Y10T 29/49117* (2015.01)

(58) Field of Classification Search
CPC ............. G01R 27/2605; G01R 27/028; G01R 27/312; G01R 27/08; G01R 27/2805; G01R 27/2812; G01D 5/2417; G01D 5/24; H03K 17/955; H03K 17/962

USPC .................. 324/658–661, 686; 345/173, 174; 349/113, 118, 176, 132

See application file for complete search history.

(56) References Cited

U.S. PATENT DOCUMENTS

5,917,165 A 6/1999 Platt et al.
5,973,417 A 10/1999 Goetz et al.
(Continued)

FOREIGN PATENT DOCUMENTS

DE 101 07 975 10/2002
EP 1672283 6/2006
(Continued)

OTHER PUBLICATIONS

Machine translation of WO 2006/018214.*
(Continued)

*Primary Examiner* — Tung X Nguyen
*Assistant Examiner* — Thang Le
(74) *Attorney, Agent, or Firm* — Lee & Hayes, PLLC

(57) ABSTRACT

A sensor element device for a capacitive contact switch for an operator control device with an operator panel has a molded body of an electrically nonconducting material. The molded body has an upper side that lies against an underside of the control panel in the assembled state. The molded body is transparently formed in certain portions in a direction perpendicular to its upper side as an illuminated indicator and is provided on its upper side with an electrically conductive coating. The electrically conductive coating serves as a capacitive sensor element of the capacitive contact switch and has at least one recess, which has been produced by means of a laser, to form a symbol.

11 Claims, 4 Drawing Sheets

(56) References Cited

U.S. PATENT DOCUMENTS

| | | | |
|---|---|---|---|
| 6,664,489 B2 * | 12/2003 | Kleinhans et al. | 200/313 |
| 7,915,553 B2 * | 3/2011 | Arione | H03K 17/962 200/314 |
| 8,462,022 B2 * | 6/2013 | Roth | H03K 17/962 200/310 |
| 9,077,345 B2 * | 7/2015 | Gourlay | G02B 6/0043 |
| 2002/0167704 A1 | 11/2002 | Kleinhans et al. | |
| 2003/0122794 A1 | 7/2003 | Caldwell | |
| 2006/0131159 A1 | 6/2006 | Kaps et al. | |
| 2006/0243462 A1 * | 11/2006 | Schilling | H03K 17/975 172/10 |
| 2006/0272532 A1 | 12/2006 | Rainer et al. | |
| 2007/0068789 A1 | 3/2007 | Streifler | |
| 2009/0090605 A1 * | 4/2009 | Arione | H03K 17/962 200/314 |
| 2009/0115645 A1 | 5/2009 | Roth | |
| 2009/0261088 A1 | 10/2009 | Isoda et al. | |
| 2009/0761088 | 10/2009 | Isoda et al. | |
| 2009/0303201 A1 | 12/2009 | Isoda et al. | |
| 2010/0096382 A1 | 4/2010 | Sakakibara et al. | |
| 2010/0155206 A1 * | 6/2010 | Arione | H03K 17/962 200/314 |
| 2010/0170276 A1 * | 7/2010 | Kang et al. | 62/259.1 |
| 2010/0176112 A1 * | 7/2010 | Izutani et al. | 219/220 |
| 2011/0025643 A1 | 2/2011 | Dombrowski et al. | |
| 2011/0133815 A1 | 6/2011 | Caldwell | |

FOREIGN PATENT DOCUMENTS

| | | |
|---|---|---|
| WO | WO 2006/018214 | 2/2006 |
| WO | WO 2011/012501 | 2/2011 |

OTHER PUBLICATIONS

International Preliminary Report on Patentability dated Feb. 7, 2012 in PCT/EP2010/060488.

* cited by examiner

SENSOR ELEMENT DEVICE AND METHOD FOR PRODUCING A MOLDED BODY OF A SENSOR ELEMENT DEVICE

CROSS REFERENCE TO RELATED APPLICATIONS

This application is a continuation of PCT/EP2010/060488, filed on Jul. 20, 2010, which in turn claims priority to DE 10 2009 036 161.8, filed on Jul. 28, 2009, the contents of both of which are incorporated by reference for all that they teach.

BACKGROUND

The invention generally relates to a sensor element device for a capacitive contact switch of an operator control device having a control panel, as well as a method for producing a molded body of a sensor element device.

DE 10 2004 040 998 A1 discloses an indicating device for an electrical appliance and a method for producing such an indicating device. The indicating device has a transparent molded body, which is for the most part surrounded by an opaque enclosure. The enclosure may be, for example, a further molded body shaped in a cup-like manner, or a dipping lacquer. The cup-like molded body or the lacquer coating has interruptions, the inner contours of which correspond to the outer contours of the pictograms to be represented by means of the indicating device.

Furthermore, U.S. Pat. No. 5,973,417, for example, discloses capacitive contact switches for operator control devices. It is within this context that the concepts and technologies herein are disclosed.

SUMMARY

An object addressed by the invention is that of providing a sensor element device for a capacitive contact switch that also can be used as an indicating device and that can be easily produced, and also provide a method as mentioned.

In one embodiment disclosed herein, a capacitive sensor element device is provided for a capacitive contact switch of an operator control device having a control panel, wherein the sensor element device includes a molded body of an electrically nonconducting material, and wherein the molded body has an upper side that lies against an underside of said control panel in an assembled state. The molded body forms an illuminated indicator with at least in certain portions transparent in a direction perpendicular to said upper side, and the molded body is provided at least on said upper side with an electrically conductive coating as the capacitive sensor element. The electrically conductive coating has at least one recess, wherein the recess is produced in the coating using a laser after having been applied to the molded body.

Advantageous and preferred refinements of the invention are the subject of the further claims and are explained in more detail below. The wording of the claims is made part of the contents of the description by express reference. Some of the following features and properties that are listed, though not exhaustively, apply both to the sensor element device and to the method. The features are sometimes only described once, but apply both to the sensor element device and to the method independently of one another. Furthermore, the sequence of the features listed is not limiting, but rather can be changed or varied to correspond to an optimized sensor element device or a corresponding method.

BRIEF DESCRIPTION OF THE DRAWINGS

Exemplary embodiments of the invention are schematically illustrated in the drawings and are explained in more detail below. Some of the embodiments shown in the individual figures have features that the other embodiments of the invention that are illustrated do not have. However, the features can be combined with one another as desired without departing from the scope of the invention. In the drawings.

DETAILED DESCRIPTION

Figure 1:
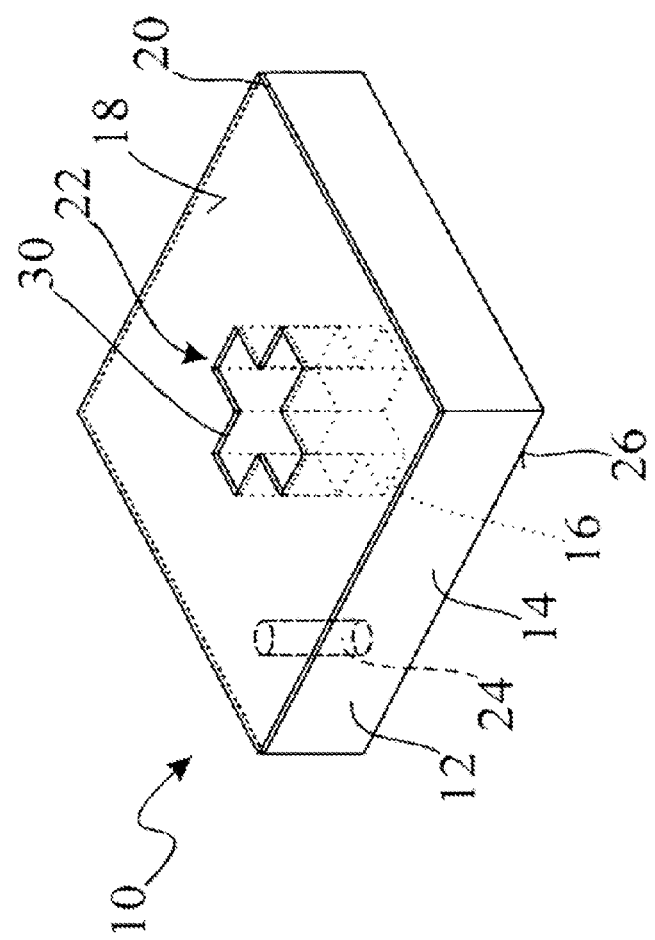
FIG. 1 shows an isometric view of a sensor element device according to a first embodiment.

The sensor element device has a molded body of an electrically nonconducting material, the molded body having an upper side that lies against an underside of the control panel in the assembled state and said molded body being formed at least in certain portions transparently in a direction perpendicular to its upper side as an illuminated indicator. At least on its upper side, it is provided with an electrically conductive coating as a capacitive sensor element.

According to one embodiment disclosed herein, a corresponding sensor element device has a molded body of an electrically nonconducting material with the electrically conductive coating. This electrically conductive coating has at least one recess, which has been produced by means of a laser in the state in which it was applied to the molded body. Said operator control devices for which the sensor element device is intended may be, for example, domestic appliances, in particular hobs, baking ovens and/or stoves or the like. It is possible for various embodiments of the sensor element device to be used in all domestic appliances in which essentially any input of parameters and/or output of information by, or to, an operator is intended. The basic function of capacitive contact switches, which of course may also be capacitive proximity switches, is known for example from U.S. Pat. No. 5,973,417, and to which reference is made. Advantageously, together with the illuminating source, the molded body forms an illuminated indicator, it being particularly advantageous for only one illuminating source to be provided for each illuminated indicator and for it to be in particular a component or a structural unit.

The electrically nonconducting material from which the molded body is produced may be, for example, a plastic, a ceramic or the like. The transparency of the molded body, at least in certain portions, can be produced by the molded body being provided with a region which is, for example, produced from transparent plastic. This region may have essentially any contour, for example a contour resembling the outer contour of the molded body. However, a contour which corresponds to the representation to be indicated by the illuminated indicator is also possible. Finally, it is also conceivable for the molded body to be produced completely from transparent material and, for example, masked.

The electrically conductive coating may be applied to the molded body by essentially any method. For example, spraying, dipping, evaporation coating or depositing may be used to applied the coating. The coating is preferably provided at least temporarily, until the recess is burned out or produced by means of the laser, and at least in the regions of the upper side of the molded body that are transparently formed.

The recesses that are introduced into the coating and are produced by means of the laser serve the purpose of indicating the symbols or pictograms or the like that are to be represented by means of the illuminated indicator. The recesses may be advantageously just introduced into the coating or provided therein. Depending on the effect to be achieved, the recesses may also extend into the molded body. In this way, a particular diffusive pattern of the illuminated indicator could be achieved, for example, by a deliberately or coincidentally produced state of the surface of the molded body in the region of the recess. Normally, however, the recess is only introduced, in particular burned, into the coating alone.

The use of an electrically conductive coating that is applied to an electrically nonconducting molded body advantageously achieves the effect that a single standardized molded body can be used with the sensor element described here, or else without a sensor effect. With a laser, the recesses are introduced into the coating by means of a machining process for the production of the illuminated indicator that is well mastered, easy to reproduce, and easy to adapt to changing circumstances.

The molded body or the sensor element device may be arranged in the region of essentially any illuminating source and/or has recesses for receiving the illuminating source. The illuminating source may serve at least as a light source of the illuminated indicator.

In another embodiment disclosed herein, the coating is a so-called conductive lacquer. A conductive lacquer is, for example, a suspension with particles of copper, silver, zinc, graphite or the like. The conductive lacquer may, for example, be sprayed onto the molded body or be applied by a dip coating process.

In a further embodiment disclosed herein, the coating is opaque. This achieves the effect that only the recesses produced by means of the laser can be perceived as an illuminating region of the illuminated indicator, in particular as a corresponding symbol or pictogram.

In another embodiment disclosed, at least one electrically conducting, pin-like component is incorporated in the molded body, the pin-like component electrically connecting the coating to a component carrier, in particular to an electrical or electronic circuit. With preference, two, three or four pin-like components are provided on the molded body, forming regular or irregular patterns, for example in corner regions and/or in regions of side edges. The pin-like components are directly and/or indirectly in electrical contact with the coating. Furthermore, these pin-like components serve on the one hand as a means for fixing the sensor element device on a component carrier and on the other hand for establishing electrical contact between the coating, which indeed represents a capacitive sensor element, and the component carrier. For this purpose, the pin-like components may be arranged in recesses in the component carrier. Alternatively, they may be produced as one part with the molded body and/or the component body, for example injection-molded. With an appropriate arrangement of the recesses, they may, by acting together with the pin-like components, also represent a form coding. By means of the form codings, it can be ensured that the sensor element devices can only be arranged on the component carrier in a single orientation in relation thereto.

The recesses in the component carrier may have an electrically conductive coating, and so the pin-like components are connected to the component carrier in the manner of plug-in contacts. It is conceivable in this respect for the pin-like components to additionally have correspondingly formed, spring-like portions or the like, in order for example to achieve a clamping effect in the recesses. As an alternative to this, the pin-like components may, as in the case of any other electronic component, be additionally soldered to the component carrier as so-called soldered lugs, and/or be adhesively bonded by electrically conductive adhesive.

In another embodiment of the invention, at least one electrically nonconducting, pin-like component, which is likewise at least partially provided with an electrically conductive coating, is provided on the molded body. The coating applied to the molded body is connected to this coating on the pin-like component, in particular by the coating covering over the molded body and the pin-like component essentially completely. Complete coverage can be easily achieved, for example, by the coating being applied to the molded body by means of a dipping process. The electrical connection of the capacitive sensor element, that is to say the coating on the molded body, to the component carrier can then take place according to the description given above.

In a further embodiment of the invention, the recess has the form of a pictogram and/or at least one numeral. In this way, the function of the respective operator control part can be represented to an operator.

In a embodiment of the invention, the molded body has a transparent inner region, which advantageously extends perpendicularly in relation to the coated upper side, this inner region preferably being surrounded by an opaque region. It may alternatively be provided that the molded body is completely transparent and has the coating on its upper side and on its sides extending perpendicularly in relation to the upper side, whereas these sides are the lateral sides. The coating is opaque at least in the side region of the molded body. Therefore, a molded body may be used that is formed homogeneously in one piece, that is to say a molded body, which is produced just from one material, or a molded body that is inhomogeneous in one piece. "Inhomogeneous" is understood herein to mean that the properties of the material that is used for the inner region of the molded body differ in at least one respect from the properties of the material that is provided for the region which surrounds the inner region of the molded body.

The opaqueness is provided in order that no lateral diffused light emerges from the side regions of the molded body, only from the recesses or pictograms provided for representing the function that is to be controlled by means of the sensor element device.

A feature provided by one embodiment of the invention is achieved by a method for producing a molded body of a sensor element device which comprises the step of initially forming the molded body, the step of applying a coating to an upper side of the molded body, and the step of producing a recess in the coating by means of a laser.

These and further features emerge not only from the claims but also from the description and the drawings, where the individual features can be realized in each case by themselves or as a plurality in the form of subcombinations in an embodiment of the invention and in other fields and can constitute advantageous and inherently protectable embodiments, for which protection is claimed here. The subdivision of the application into individual sections and subheadings does not restrict the general validity of the statements made thereunder.

FIG. 1 shows a sensor element device 10, which has a molded body 12. The molded body 12 is of an essentially two-part construction. It has an outer region 14, which surrounds an inner region 16, the outer region 14 being of an opaque form and the inner region 16 being of a transparent form. Both the outer region 14 and the inner region 16 are produced from plastic. The inner region 16 has a cross-shaped outer contour, which, when the sensor element device is being used as an illuminated indicator, can be perceived as a plus symbol. The molded body 12 has on its upper side 18 a coating 20, which completely covers the outer region 14. The coating 20 is electrically conductive. The molded body 12 is passed through in the outer region 14 by an electrically conducting, pin-like component 24 in such a way that the pin-like component 24 makes it possible for electrical contact to be established with the coating 20 from an underside 26 of the molded body 12.

The coating 20 has above the inner region 16 a recess 30 with an inner contour corresponding to the inner region 16. The recess 30 has been produced, for example burned out, by means of a laser that is not represented from a coating 20 originally applied to the molded body 12 over essentially its full surface area.

Figure 2:
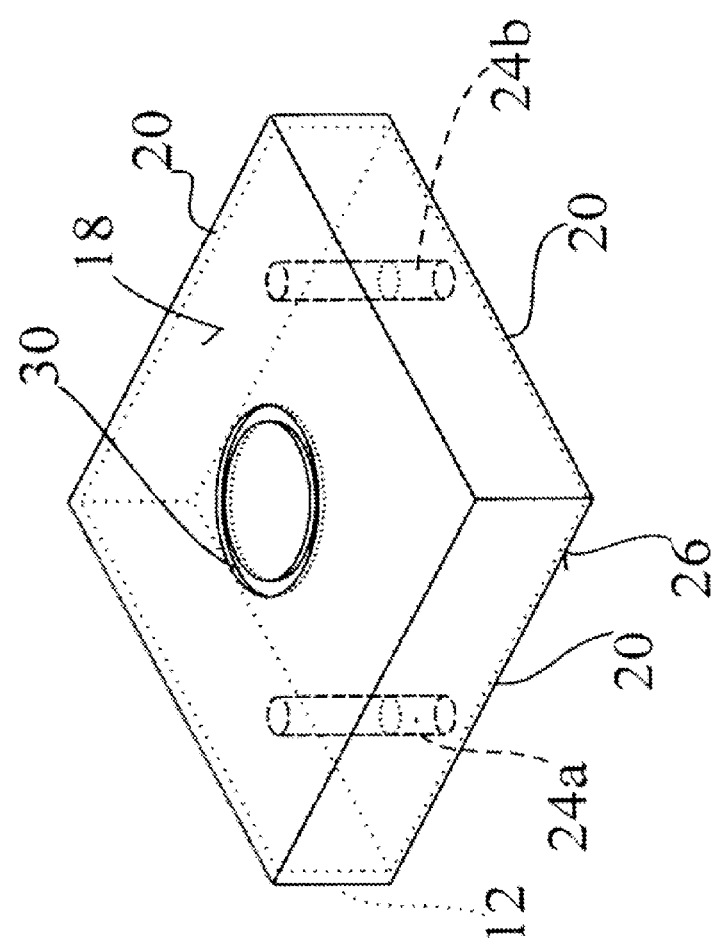
FIG. 2 shows an isometric view of a sensor element device according to a second embodiment.

In distinction from the embodiment shown in FIG. 1, in FIG. 2 the molded body 12 is formed in one piece, that is to say without an inner region and outer region. The molded body 12 is provided with the coating 20, which is formed as a conductive lacquer, completely, that is to say on every outer side. This conductive lacquer has been applied by a dip coating process. Following the dip coating process, that is to say after the lacquer has dried, an annular recess 30 was produced in the coating in the region of the upper side 18 of the molded body 12. This recess was once again made by means of a laser that is not represented.

As a further distinction of FIG. 2 from FIG. 1, the type and number of pin-like components 24a, 24b provided can be seen. According to FIG. 2, the pin-like components 24a, 24b are produced from an electrically nonconducting material. However, the pin-like components 24a, 24b are likewise covered by the coating 20. Furthermore, the pin-like components 24a, 24b protrude beyond the underside 26 of the molded body 12. In this way, they can be connected to a component carrier that is not represented in FIG. 2, for example a printed circuit board or the like, as known from other electrical and/or electronic components, for example by insertion into electrically conductively coated recesses.

It should be noted that the form, position and other configuration of the pin-like components can be chosen essentially as desired. As will become apparent below, the pin-like components 24 should be arranged and chosen with appropriate dimensions in such a way that the sensor element device 10 can be fastened on a component carrier that is not represented in FIGS. 1 and 2 and/or that the electrically conductive coating 20 can be connected to an electrical or electronic circuit.

Figures 3A, 3B:
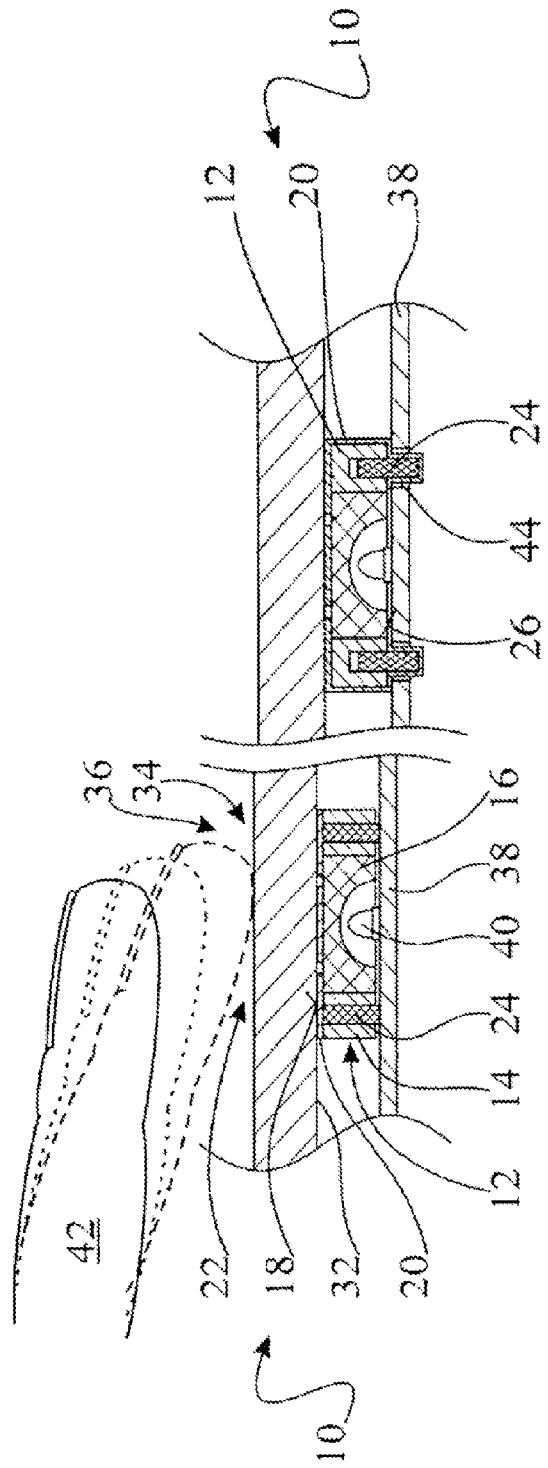
FIGS. 3a and 3b show a sectional side view of a sensor element device according to a third and fourth embodiment respectively, installed in an operator control device of a domestic appliance.

The sensor element device 10 represented in FIG. 3a is arranged on an underside 32 of a control panel 34 of an operator control device 36. The sensor element device 10 has a molded body 12 comprising an outer region 14 and an inner region 16. The outer region 14 is passed through by pin-like components 24 in such a way that they connect the coating 20 on the upper side 18 of the molded body 12 to a component carrier 38. Arranged on the side of the component carrier 38 that is facing the molded body 12 is an illuminating source 40, which can be in one embodiment an LED, for illuminating the illuminated indicator 22. According to FIG. 3a, the coating 20 of the sensor element device 10 is electrically connected to the component carrier 38 by means of the pins 24. The sensor element device 10 is arranged on the control panel in such a way that the coating 20 can be used as a capacitive sensor element of a capacitive contact switch or a capacitive proximity switch. The contact or proximity switch can be operated in a known way, for example by means of a finger 42 or the like of an operator, and the status of the contact or proximity switch is evaluated by means of an electronic or electrical circuit, which is for example arranged on the component carrier 38.

As a difference from the sensor element device 10 of FIG. 3a, the sensor element device 30 that is represented in FIG. 3b is enclosed essentially completely by a coating 20. The coating 20 also extends over the pin-like components 24, which, as a difference from the pin-like components 24 of FIG. 3a, protrude well beyond the underside 26 of the molded body 12 according to FIG. 3b. In this way, the pin-like components 24 can be introduced into recesses 44 in the component carrier 38 that are coated in an electrically conductive manner, for example with the copper of the component carrier. The pin-like components 24, but in particular the coating 20 thereupon, make it possible for electrical contact to be established between the sensor element and the component carrier 38 or an electrical circuit applied to the component carrier. The pin-like components 24 may also advantageously be molded onto the molded body as one part.

Figures 4A, 4B:
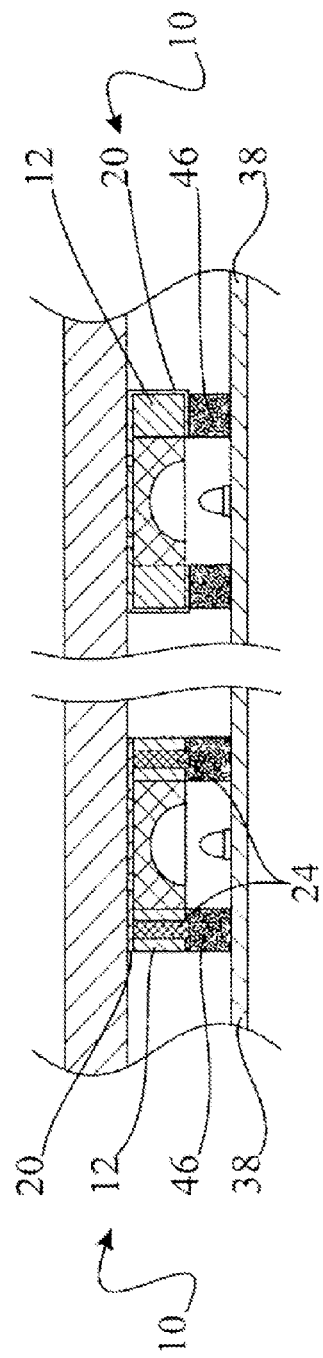
FIGS. 4a and 4b show sectional side views of a sensor element device according to a fifth embodiment to a sixth embodiment, respectively, installed in an operator control device of a domestic appliance.

In distinction from FIGS. 3a and 3b, the sensor element device 10 in FIGS. 4a and 4b does not lie directly on the component carrier 38. Rather, the sensor element device 10, in particular the molded body 12 including the coating 20, is arranged on a foam-rubber-like ring 46. The foam-rubber-like ring is of an electrically conducting form and opaque. In this manner, the foam-rubber-like ring 46 forms an electrical connection between the pin-like components 24 or the coating 20 and the component carrier 38. Furthermore, the foam-rubber-like ring 46 prevents diffused light from emerging to the side. Such a ring is described in German patent application DE 10 2009 036 162 A, the contents of which are incorporated by reference for all that it teaches.

The invention claimed is:

1. A capacitive sensor element device for a capacitive contact switch of an operator control device having a control panel, said sensor element device comprising:
   a molded body comprising an electrically nonconducting material,
      said molded body comprising an upper side disposed underneath an underside of said control panel in an assembled state,
      said molded body comprising a transparent portion arranged in a direction perpendicular to said upper side, wherein said transparent portion being capable of receiving and transmitting visible light therethrough from an illumination source, and
      said molded body comprising an opaque electrically conductive coating covering at least said upper side of said molded body and disposed against said underside of said control panel in said assembled state for operation of said capacitive sensor element; and
   at least a portion of a pin-like component being incorporated into said molded body and able to electrically connect said opaque electrically conductive coating to a component carrier and an electrical circuit,
   wherein said opaque electrically conductive coating comprises at least one recess, said at least one recess having been produced in said opaque electrically conductive coating using a laser after covering said molded body.

2. The sensor element device as claimed in claim 1, wherein said opaque electrically conductive coating is a conductive lacquer.

3. The sensor element device as claimed in claim 1, wherein said opaque electrically conductive coating is opaque.

4. The sensor element device as claimed in claim 3, wherein said recess comprises a form of a pictogram.

5. The sensor element device as claimed in claim 3, wherein said recess comprises a form of a numeral.

6. The sensor element device as claimed in claim 1, wherein said pin-like component being at least partially covered with said opaque electrically conductive coating.

7. The sensor element device as claimed in claim 6, wherein said opaque electrically conductive coating covering at least a portion of said molded body is electrically connected to said opaque electrically conductive coating covering at least a portion of said at least one pin-like component incorporated into said molded body.

8. The sensor element device as claimed in claim 7, wherein said opaque electrically conductive coating covers said molded body and said at least one pin-like component.

9. The sensor element device as claimed in claim 1, wherein the transparent portion comprising an inner region within said molded body surrounded by an opaque region.

10. The sensor element device as claimed in claim 1, wherein said opaque electrically conductive coating covering other lateral sides of said molded body extending perpendicularly relative to said upper side, wherein said opaque electrically conductive coating is opaque at least in said upper side.

11. A method for producing a molded body of a capacitive sensor element device for a capacitive contact switch of an operator control device having a control panel, wherein said sensor element device comprises a molded body comprising an electrically nonconducting material, said molded body comprising an upper side arranged underneath an underside of said control panel in an assembled state, said molded body comprising a transparent portion arranged in a direction perpendicular to said upper side, wherein said transparent portion being capable of receiving and transmitting visible light therethrough from an illumination source, and said molded body comprising an opaque electrically conductive coating covering at least said upper side for operation of said capacitive sensor element, wherein said sensor element device comprises at least a portion of a pin-like component being incorporated into said molded body and able to electrically connect said opaque electrically conductive coating to a component carrier and an electrical circuit, wherein said opaque electrically conductive coating comprises at least one recess, said at least one recess having been produced in said opaque electrically conductive coating using a laser after covering said molded body, the method comprising the steps of:

initially forming said molded body with an upper side and said at least a portion of said pin-like component being incorporated onto said molded body as one part;

applying said opaque electrically conductive coating to said upper side of said molded body and said portion of said pin-like component; and producing a recess in said opaque electrically conductive coating by means of a laser.

* * * * *